United States Patent
Sharma et al.

(10) Patent No.: US 6,868,682 B2
(45) Date of Patent: Mar. 22, 2005

(54) AGENT BASED CONTROL METHOD AND SYSTEM FOR ENERGY MANAGEMENT

(75) Inventors: Ratnesh K. Sharma, Union City, CA (US); Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/345,723

(22) Filed: Jan. 16, 2003

(65) Prior Publication Data

US 2004/0141542 A1 Jul. 22, 2004

(51) Int. Cl.[7] .......................... F25D 17/00; F25D 23/12
(52) U.S. Cl. .......................... 62/180; 62/259.2; 62/229; 361/696
(58) Field of Search .................. 62/180, 178, 259.2, 62/228.4, 229; 361/696

(56) References Cited

U.S. PATENT DOCUMENTS

| | | | | |
|---|---|---|---|---|
| 5,345,779 A | * | 9/1994 | Feeney | 62/259.2 |
| 5,467,609 A | * | 11/1995 | Feeney | 62/259.2 |
| 6,283,380 B1 | * | 9/2001 | Nakanishi et al. | 236/49.3 |
| 6,374,627 B1 | * | 4/2002 | Schumacher et al. | 62/259.2 |
| 6,412,292 B2 | * | 7/2002 | Spinazzola et al. | 62/89 |
| 6,494,050 B2 | * | 12/2002 | Spinazzola et al. | 62/89 |
| 6,557,357 B2 | * | 5/2003 | Spinazzola et al. | 62/89 |
| 6,557,624 B1 | * | 5/2003 | Stahl et al. | 165/53 |
| 6,574,104 B2 | * | 6/2003 | Patel et al. | 361/695 |
| 6,574,970 B2 | * | 6/2003 | Spinazzola et al. | 62/89 |
| 6,628,520 B2 | * | 9/2003 | Patel et al. | 361/696 |
| 6,672,955 B2 | * | 1/2004 | Charron | 454/184 |
| 6,694,759 B1 | * | 2/2004 | Bash et al. | 62/180 |
| 2004/0020224 A1 | * | 2/2004 | Bash et al. | 62/228.4 |
| 2004/0020225 A1 | * | 2/2004 | Patel et al. | 62/229 |
| 2004/0020226 A1 | * | 2/2004 | Bash et al. | 62/229 |

* cited by examiner

Primary Examiner—Marc Norman

(57) ABSTRACT

Controlling the temperature in a data center includes receiving sensory data corresponding to a temperature from a subsystem in a data center, processing the sensory data by a first agent in a hierarchy of agents to determine if the subsystems in the data center is operating within a predetermined temperature range, adjusting a delivery rate for a cooling fluid using the first agent to keep the temperature range of the subsystem within the predetermined temperature range, and requesting a second agent from the hierarchy of agents to process the sensory data when the first agent cannot keep the temperature range within the predetermined temperature range unless the second agent redistributes the cooling fluid being delivered. A third agent is used to vary the amount of cooling fluid output when at least the first and second agent cannot keep the subsystem operating within the predetermined temperature range.

30 Claims, 9 Drawing Sheets

US 6,868,682 B2

AGENT BASED CONTROL METHOD AND SYSTEM FOR ENERGY MANAGEMENT

CROSS-REFERENCE TO RELATED APPLICATIONS

This application relates to the subject matter disclosed in the co-pending U.S. application Ser. No. 09/970,707, by Patel et al., filed, titled "SMART COOLING OF DATA CENTERS", and assigned to the assignee of the present invention.

BACKGROUND OF THE INVENTION

Aspects of the present invention relate to cooling systems for data centers.

A data center is generally defined as a room, or in some cases, an entire building or buildings, that houses numerous printed circuit (PC) board electronic systems arranged in a number of racks. Multiple racks are arranged into a row. The standard rack may be defined according to dimensions set by the Electronics Industry Association (EIA) for an enclosure: 78 in. (2 meters) wide, 24 in. (0.61 meter) wide and 30 in. (0.76 meter) deep.

Standard racks can be configured to house different combination of components including servers, networking equipment, and/or storage devices. In some cases, the components are embedded in a number of PC boards, ranging from about forty (40) boards, with future configuration of racks being designed to accommodate up to eighty (80) boards. The PC boards may include a number of sub-components, e.g., processors, micro-controllers, high-speed video cards, memories, and semi-conductor devices that dissipate relatively significant amounts of heat during the operation. For example, a typical PC board with multiple microprocessors may dissipate as much as 250 W of power. Consequently, a rack containing 40 PC boards of this type may dissipate approximately 10 KW of power.

Generally, the power used to remove heat generated by the components is equal to about 10 percent of the power used for their operation. However, the power required to remove the heat dissipated by the same components configured into a multiple racks in a data center is generally greater. In many cases, the cooling load required in the data center corresponds to the power drawn by the servers and can be equal to about 50 percent of the power used for their operation. For example, in vapor-compression driven cooling systems, the power drawn by compressors alone can be as high as 30% of the power consumed by servers in a data center.

The difference in required power for dissipating the various heat loads between racks and data centers can be attributed to the additional thermodynamic work needed in the data center to cool the air. For example, racks typically use fans to move cooling fluid (e.g., air) across the heat dissipating components for cooling. Data centers in turn often implement reverse power cycles to cool heated return air from the racks. This additional work associated with moving the cooling fluid through the data center and cooling equipment consumed large amounts of energy and makes cooling large data centers difficult.

In practice, conventional data centers are cooled using one or more Computer Room Air Conditioning units, or CRAC units. The typical compressor unit in the CRAC is powered using a minimum of about thirty (30) percent of the power required to sufficiently cool the data centers. The other components, e.g., condensers, air movers (fans), etc., typically require an additional twenty (20) percent of the required cooling capacity.

As an example, a high density data center with 100 racks, each rack having a maximum power dissipation of 10 KW, generally requires 1 MW of cooling capacity. Consequently, air conditioning units having the capacity to remove 1 MW of heat generally require a minimum of 300 KW to drive the input compressor power and additional power to drive the air moving devices (e.g., fans and blowers).

Conventional data center CRAC units do not vary their cooling fluid output based on the distributed needs of the data center. Instead, these CRAC units generally operate at or near a maximum compressor power even when the heat load is reduced inside the data center. This substantially continuous operation of the CRAC units is generally designed to operate according to a worst-case scenario. That is, cooling fluid is supplied to the components at around 100 percent of the estimated cooling requirement. Often, these conventional cooling systems attempt to cool components even though they may not be operating at a level that exceeds a predetermined temperature range. Moreover, conventional systems generally measure ambient temperature at sensors located at the CRAC units, and not at the locations in the data center where the racks and heat-producing equipment is located. For at least these reasons, conventional cooling systems generally incur greater amounts of operating expenses than may be necessary to sufficiently cool the heat-generating components contained in the racks of data centers.

SUMMARY OF THE INVENTION

Figure 1:
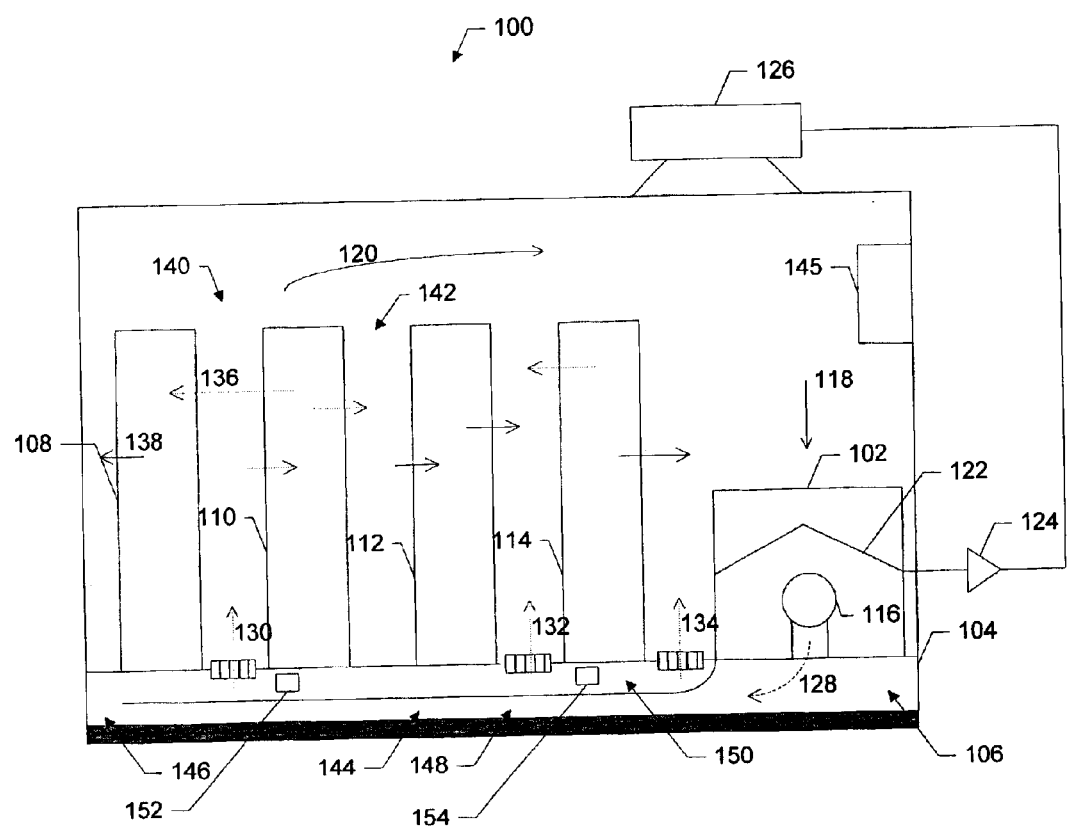
FIG. 1 illustrates a schematic representation of a data center containing a cooling system in accordance with one implementation of the present invention.

One aspect of the invention features a method of controlling the temperature in a data center. The temperature control includes receiving sensory data corresponding to a temperature from a subsystem in a data center, processing the sensory data by a first agent in a hierarchy of agents to determine if the subsystems in the data center is operating within a predetermined temperature range, adjusting a delivery rate for a cooling fluid using the first agent to keep the temperature range of the subsystem within the predetermined temperature range, and requesting a second agent from the hierarchy of agents to process the sensory data when the first agent cannot keep the temperature range within the predetermined temperature range unless the second agent redistributes the cooling fluid being delivered to one or more areas in the data center.

Another aspect of the invention describes a system for cooling a data center. The system includes a cooling fluid delivery controller that uses a first agent in a hierarchy of agents to control the delivery rate of a cooling fluid to a rack having one or more subsystems and components and a second agent in the hierarchy of agents to control the delivery rate of the cooling fluid to a row having one or more racks, and a cooling system controller that uses a third agent in the hierarchy of agents to control the amount of cooling fluid to output when at least the first and second agent cannot keep the one or more subsystems operating within a predetermined temperature range.

In a further aspect of the invention, a method of controlling the temperature of a rack in a data center uses a rack agent that receives sensor information and objectives to keep the subsystems and components operating within a temperature range, compares the temperature received from the sensors to the rack agent's objectives, determines whether the temperature readings meet its objectives and having the rack agent report its sensor readings to a row agent for further processing, and varies the flow of liquid cooling when the temperature reading does not meet the rack agent's objectives.

Yet another aspect of the invention controls the temperature of a row in a data center using a row agent that receives sensor information and objectives to keep the subsystems and components operating within a temperature range, compares the temperature received from the sensors to the row agent's objectives, determines whether the temperature readings meets the row agents objectives and having the row agent report its sensor readings to a CRAC agent or other row agents for further processing, and varies the flow of liquid cooling when the temperature reading does not meet the row agent's objectives.

Another aspect of the present invention controls the temperature of in a data center using a cooling system agent that receives sensor information and objectives to keep the subsystems and components operating within a temperature range, compares the temperature received from the sensors to the cooling system agent's objectives, determines whether the temperature readings meets the cooling system agents objectives and having the cooling system agent report its sensor readings to other cooling system agents for further processing, and varies the cooling system's output of a cooling liquid when the temperature reading does not meet the cooling system agent's objectives.

The details of one or more embodiments of the invention are set forth in the accompanying drawings and the description below. Other features and advantages of the invention will become apparent from the description, the drawings, and the claims.

DETAILED DESCRIPTION

According to one implementation of the present invention, a cooling system is configured to adjust cooling fluid, e.g., air, flow to various racks located throughout a data center, e.g., location that houses numerous printed circuit (PC) board electronic systems arranged in a number of racks, based upon the detected or anticipated temperatures at various locations throughout the data center. Implementations of the present invention utilize distributed agents at various points in the cooling system to direct cooling fluid (e.g., airflow) to reduce power consumption and cool more effectively.

At least one or more of the following advantages can be realized using implementations of the present invention. In one aspect, the distributed agents can better monitor events by processing information in parallel at different points on the cooling system. Individual thresholds and routines can be associated with each agent giving them limited autonomy when controlling operation of a component (e.g., rack, row, CRAC) in the cooling system. Agents can also summon assistance from other peer components or higher order components when local control does not meet certain objectives. For example, a rack agent can request assistance from another rack agent for cooling or can request additional cooling capacity from a CRAC through a CRAC or cooling system agent. In another aspect, implementations of the present invention are highly scalable as agents are distributed throughout a cooling system and added as the cooling system becomes larger and more complex. Yet another aspect of the present invention facilitates more accurate monitoring of energy levels and cooling efficiency as additional sensors can be more carefully monitored by agents in a distributed cooling environment.

FIG. 1 shows a schematic illustration of a data center 100 containing a cooling system 102. Data center 100 includes a raised floor 104 covering wires and communication lines (not shown) located in space 106 beneath raised floor 104. In this example, space 106 functions as a plenum to deliver cooling fluid from cooling system 102 to racks 108, 110, 112, and 114. Although data center 100 illustrated in FIG. 1 contains four racks and one cooling system, it should be understood that other data center configurations may include any number of racks and cooling systems. Accordingly, four racks are illustrated in FIG. 1 for descriptive purposes only and should not be construed to limit implementations of the present invention in any respect.

Racks 108, 110, 112, and 114 generally house a variety of components including servers, networking equipment, and/or storage drives, Alternatively, racks can also include processors, micro-controllers, high speed video cards, memories, semi-conductor devices, and other components that need cooling. In operation, the subsystems and corresponding components can be used to perform various functions including computing, switching, routing, and displaying, using electronic and other mediums. In the performance of these functions, the components, and therefore the subsystems, generally dissipate relatively large amounts of heat. As racks 108, 110, 112, and 114 are designed to include a larger number of subsystems, they may require substantially large amounts of cooling fluid to keep the subsystems and the components operating within a predetermined temperature range. For example, it may be difficult to control the cooling fluid used on a rack or set of racks having forty (40) or more subsystems operating within a temperature range.

According to one aspect of the present invention, agents distributed throughout subsystems and cooling systems in data center 100 can be used to more efficiently deliver cooling fluid to the components and the subsystems located in the racks 108, 110, 112, and 114 based upon measuring and controlling heat loads and the power consumed by cooling system 102 to supply the cooling fluid.

Cooling system 102 generally includes a fan 116 for supplying cooling fluid into space 106 (e.g., plenum). Air is supplied into fan 116 from the heated air in data center 100 as indicated by arrows 118 and 120. In operation, the heated air enters into cooling system 102 as indicated by arrow 118 and is cooled by a cooling coil 122, a compressor 124, and a condenser 126 operating together with agents of the present invention in various configurations.

Depending upon the cooling fluid needed by heat loads in the racks 108, 110, 112, and 114, cooling system 102 may be operated at various levels using agents designed in accordance with implementations of the present invention. For example, the capacity (e.g., the amount of work exerted on the refrigerant) of compressor 124 and the speed of the fan 116 may both be modified by agents to thereby control the temperature and the amount of cooling fluid flow delivered to the racks 108, 110, 112, and 114. To achieve this, compressor 124 is a variable capacity compressor and the fan 116 is a variable speed fan. Agents of the present implementation can control compressor 124 by either increasing or decreasing the mass flow rate of its refrigerant. Because the specific type of compressor 124 and fan 116 to be employed with the embodiments of the invention may vary according to particular needs, the invention is not limited to any specific type of compressor or fan. Instead, the choice of compressor 124 and fan 116 may depend upon many factors, including cooling requirements, costs, operating expenses, reliability and other operating characteristics. Generally, a suitable compressor 124 and fan 116 is capable of accomplishing certain aspects of the invention.

The cooling fluid generally flows from fan 116 and into space 106 (e.g., plenum) as indicated by the arrow 128. The cooling fluid flows out of raised floor 104 through dynamically controllable vent tiles 130, 132, and 134 that agents designed in accordance with the present invention operate upon to control the velocity and the volume flow of the cooling fluid. In one respect, agents regulate the velocity and the volume flow rate of the cooling fluid by varying the shape and/or opening size of the vent tiles 130, 132 and 134. By using agents of the present invention in this manner, racks 108, 110, 112, and 114 may receive substantially individualized and localized amounts of cooling fluid according to their heat loads.

Dotted arrows 136 indicate the general direction of travel of the cooling fluid and solid arrows 138 indicate the general direction of travel of the cooling fluid being heated by the heat dissipating components located within racks 108, 110, 112, and 114. As depicted in FIG. 1, the areas between racks 108, 110, 112, and 114 may comprise either cool aisles 140 or hot aisles 142, or a combination thereof. Cool aisles 140 are those aisles including vent tiles 130–134 and thus receive cooling fluid for delivery to racks 108, 110, 112, and 114. Hot aisles 142 are those aisles that receive air heated by the heat dissipating components in racks 108, 110, 112, and 114.

In addition, various sections of each of racks 108, 110, 112, and 114 may also receive substantially individualized amounts of cooling fluid. By way of example, if the bottom halves of racks 108 and 110 are operating at maximum power, thereby dissipating a maximum level of heat load, and the upper halves are operating at little or no power, agents operating vent tile 130 can facilitate a relatively high volume flow rate with a relatively low velocity. In this manner, the cooling fluid may operate to generally supply greater cooling to the lower halves of racks 108 and 110, whereas the upper halves receive relatively lesser amounts of cooling fluid. In addition, if the upper halves of racks 112 and 114 are operating at approximately 50 percent of their maximum power, and the lower halves are operating at little or no power, agents operating vent tile 132 can facilitate a relatively low volume flow rate with a relatively high velocity to better cool the upper halves of these racks. In this manner, agents designed in accordance with the present invention can control cooling fluid flow and momentum to adequately reach and cool upper and lower halves of racks 112 and 114.

Agents of the present invention may also vary the amount of cooling fluid supplied to the racks as the cooling requirements vary according to the heat loads in racks 108, 110, 112, and 114, and the subsequent variations in the volume flow rate of the cooling fluid in cooling system 102. For example, if the heat load in racks 108, 110, 112, and 114 increases, agents in cooling system 102 may operate in accordance with implementations of the present invention to increase the supply of cooling fluid. Alternatively, if the heat load in the racks 108, 110, 112, and 114 generally decreases, agents in cooling system 102 may operate similarly to decrease the supply of cooling fluid. Agents use vent tiles 130, 132, and 134 to provide localized flow control of the cooling fluid to racks 108, 110, 112, and 114. Alternate agents operate cooling system 102 to provide global control of the cooling fluid flow. The combination of agents used to control the cooling fluid used by cooling system 102 maintains racks 108, 110, 112, and 114 at a predetermined temperature range with potentially reduced energy requirements compared with conventional data center cooling systems.

In one implementation of the present invention, the cooling fluid supply flowing through each of the vent tiles 130, 132 and 134 is maintained at a relatively uniform pressure. To achieve this uniformity, space 106 may include a divider 144 having a length extending substantially along the entire length of space 106 and generally in the direction perpendicular to the plane of FIG. 1. In one implementation, divider 144 has a width extending from cooling system 102 to substantially the end of space 106. This configuration of divider 144 in space 106 creates a gap 146 between a side edge of divider 144 and a side surface of the space as illustrated in FIG. 1. Divider 144 generally divides space 106 into two relatively separate chambers 148 and 150. Chamber 148 is in fluid communication with the outlet of fan 116 while chamber 150 is in fluid communication with the chamber 148 substantially through gap 146. In this manner, the cooling fluid flow originating from fan 116 travels substantially along the entire width of space 106 and through chamber 148 for the cooling fluid to flow into chamber 150.

A substantially uniform pressure is maintained in chamber 150 by this careful introduction of the cooling fluid. Initially, fan 116 may cause a relatively large amount of turbulence as the cooling fluid is introduced in chamber 148 at a rapid rate. This turbulence is generally greater at the outlet of fan 116 and decreases proportionally as the distance from the outlet increases. By the time the cooling fluid has traveled along chamber 148 and entered into chamber 150 it is substantially stabilized and able to provide a relatively consistent cooling fluid pressure supply for vent tiles 130, 132 and 134.

In one implementation, the pressure of the cooling fluid located in chamber 150 is measured by a pressure sensor 152. Pressure sensor 152 detects changes in the pressure of the cooling fluid located within chamber 150. Changes in pressure are relayed to one or more agents in accordance with implementations of the present invention. As described in further detail later herein, these agents can modify operation of the data center 100.

The capacity of compressor 124 may also vary depending on changes in the temperature of the cooling fluid in chamber 150. To measure these changes, a plenum temperature sensor 154 located within chamber 150 relays temperature measurements to agents in accordance with the present invention and cooling system 102. Additional temperature sensors, not illustrated in FIG. 1, may be placed in many other positions in the data center to detect localized temperature changes and gather information for processing by agents.

Agents executing on computer system 145 receive input from the temperature sensors, and send control commands to control the aperture of vent tiles 130, 132 and 134, and the speed of compressor 124 and fan 116. In one implementation, many different agents execute on computer system 145 but alternate implementations may include computer systems or microprocessors running agent software distributed throughout data center 100. In either of these or other implementations, agents balance thermal provisioning needs at the rack, row, and CRAC level to maintain an optimal, economical and efficient level of cooling in the data center.

In general, agents send commands through computer system 145 and other processor units to vent tiles 130, 132 and 134, fan 116 compressor 124 and any other portions of cooling system 102 and data center 100 responsible for cooling subsystems and components, commands to compressor 124 generally maintain the temperature of the cooling fluid within the second chamber 150 at a substantially constant level. In addition, the capacity of the compressor 124 may also vary according to detected and/or anticipated changes in heat loads generated in the racks 108, 110, 112, and 114. As an example, compressor 124 capacity may be increased as the heat loads generated in the racks 108, 110, 112, and 114 increase. Similarly, other commands sent to fan 116 may operate to alter the output of the cooling fluid or air from fan 116 and stabilize pressure in chamber 150 within the plenum. Agents further operate vent tiles 130, 132 and 134 to also balance the flow of cooling fluid and more precisely direct heat extraction from the different subsystems and components. Operating these agents together achieves more responsive cooling characteristics but results in substantial energy savings over known cooling systems expending energy as needed to cool particular components and subsystems contained in the racks.

Figure 2:
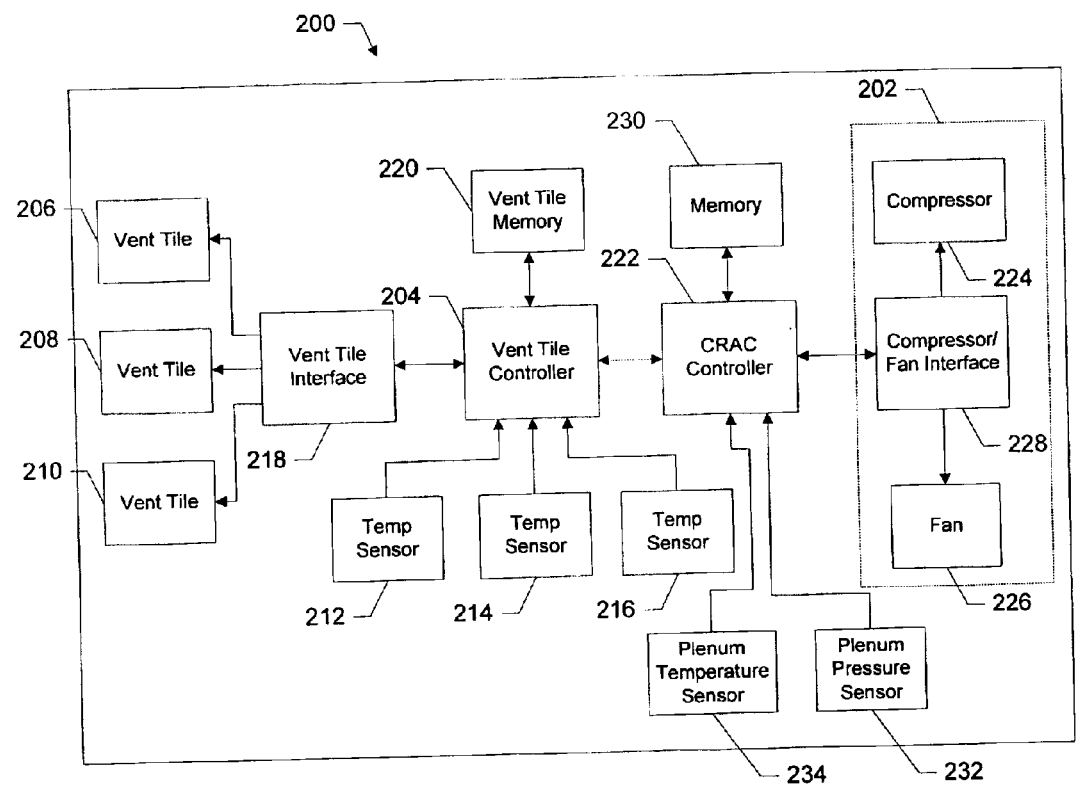
FIG. 2 is a block diagram illustration of the subsystems to control a cooling system according to one implementation of the present invention.

FIG. 2 is a block diagram of a control scheme 200 for a cooling system 202 in accordance with one implementation of the present invention. Control scheme 200 includes a vent tile controller 204 and vent tile memory 220 capable of controlling vent tiles 206, 208, and 210 through a vent tile interface 218 and responsive to input from temperature sensors 212, 214 and 216. Additionally, control scheme 200 includes a computer room air conditioning (hereinafter "CRAC") controller and CRAC memory 230, a compressor 224, and fan 226, a compressor/fan interface 228 and receives data from plenum temperature sensor 234 and plenum pressure sensor 232. Agents designed in accordance with the present invention can be executed on vent tile controller 204, CRAC controller 222, or any other processors distributed over control scheme 200.

In one implementation, a rack agent and a row agent detecting or anticipating change in the temperature of the respective racks and/or portions thereof, cause vent tile controller 204 to manipulate the corresponding vents and compensate for the change in temperature due to changes the volume flow rate, velocity, and other similar characteristics of the cooling fluid. Racks and rows of racks (hereinafter "rows") and/or portions thereof receive substantially only the amount of cooling fluid necessary to maintain the temperature of the portions of the racks within a predetermined temperature range.

Vent tile interface 218 acts as an interface between the vent tile controller 204 and the components for operating vent tiles 206, 208, and 210 including controlling the opening in the vent tiles and directing the cooling fluid flow through the vent tiles.

Vent tile controller 204 may also be interfaced with vent tile memory 220 and loaded with agents of the present invention and other software executed by vent tile controller 204 and providing functionality to cooling system 202. Vent tile memory 220 may also be configured to store data/information to manipulate each of vent tiles 206, 208 and 210 in response to the detected and/or anticipated temperatures in the racks. For example, rack agents or row agents use vent tile controller 204 to operate vent tile 206 to increase the volume flow rate and decrease the velocity of the cooling fluid flowing there through in response to a detected increase in the heat load of a lower portion of a corresponding rack. Vent tile memory 220 may be implemented as a combination of volatile and non-volatile memory, such as dynamic random access memory (DRAM), EEPROM, flash memory, or other storage mediums.

Rack agents and row agents or vent tile controller 204 may be configured to relay data/information pertaining to the flow of cooling fluid through the vent tiles 206, 208 and 210 to a CRAC controller 222. In this implementation, CRAC controller 222 is configured to control the operation of cooling system 202, including compressor 224, fan 226, and other systems used in performing heat exchange functions. CRAC controller 222 may comprise a microprocessor, a micro-controller, ASIC (application-specific integrated circuits), and other hardware necessary to perform functions associated with implementation of the present invention.

Compressor/fan interface electronics 228 may be provided to act as an interface between the CRAC controller 222 and the components for operating compressor 224 and fan 226, including varying the voltage supply to change the respective speeds of the compressor and the fan.

CRAC controller 222 may also be interfaced with CRAC memory 230 and rack agents and row agents or software providing the functionality of cooling system 202 including compressor 224 and fan 226. A CRAC agent configured to control the CRAC and cooling system 202 may be executed by CRAC controller 222. CRAC memory 230 may also be configured to provide storage for data/information for manipulating compressor 224 and fan 226 in response to variations in the cooling fluid flow through the vent tiles 206, 208 and 210. For example, a CRAC agent executing on CRAC controller 222 may operate compressor 224 and fan 226 to increase/decrease the volume flow rate of the cooling fluid flow in response to various changes in the volume flow rate and temperature being collected and/or analyzed by other agents. In one implementation, CRAC agents use a look up table stored in memory 230 and including information describing the speed of compressor 224 and fan 226 output necessary for a detected change in the volume flow rate. CRAC agents of the present invention can incrementally vary the speed of compressor 224 and fan 226 in response to detected changes in the volume flow rate. CRAC memory 230 may be implemented as a combination of volatile and non-volatile memory, such as dynamic random access memory (DRAM), EEPROM, flash memory, and other storage mediums.

As an alternate implementation, CRAC agent and CRAC controller 222 operates in response to data/information detected by plenum temperature sensor and plenum pressure sensor 232. These additional sensors allow a CRAC agent to control CRAC controller 222 and cooling system 202 components with little or no input from vent tile controller 204. This independent operation of CRAC agents and CRAC controller 222 is indicated by the dotted-line connection between CRAC controller 222 and vent tile controller 204.

Plenum pressure sensor 232 is configured to measure the pressure within the upper chamber of the plenum as described previously. The pressure measurements and/or any discernable changes in the pressure measurements obtained by plenum pressure sensor 232 may be relayed to the CRAC agent and CRAC controller 222. In addition, plenum temperature sensor 234 may be configured to measure the temperature of the cooling fluid within the upper chamber of the plenum. Similarly, temperature measurements and/or any discernable changes in the temperature obtained by the plenum temperature sensor 232 may also be relayed to CRAC agent and CRAC controller 222.

The CRAC agent executing on CRAC controller 222 may manipulate the capacity of the compressor 224 based upon the measured temperature of the cooling fluid. By properly adjusting the output of compressor 224, the temperature of the cooling fluid within the upper chamber of the plenum may be maintained at a substantially constant level. Similarly, CRAC agent manipulates the output of fan 226 based upon the measured pressure of the fluid in the upper chamber of the plenum to vary the amount of cooling fluid supplied to maintain the pressure of the cooling fluid within the upper chamber at a substantially uniform level. According, CRAC agent and CRAC controller 222 operate to increase the speed of compressor 224 and fan 226 thereby expending a greater amount of energy as the heat load in the racks requires such an increase. This avoids operating compressor 224 and fan 226 at substantially maximum or constant energy levels and reduces the amount of energy used by cooling system 202.

CRAC memory 230 may also be configured to store data/information used by CRAC agents to control the speed of compressor 224 and output of fan 226 in response to the measured pressure measured within the upper portion of the plenum. For example, CRAC agent and CRAC controller 222 may increase the output of compressor 224 and fan 226 by a relatively large amount in response to a relatively large decrease in the measured pressure. This control keeps pressure within the upper portion of the plenum at a substantially uniform level even when the pressures change by a relatively sharp amount.

Figure 3A:
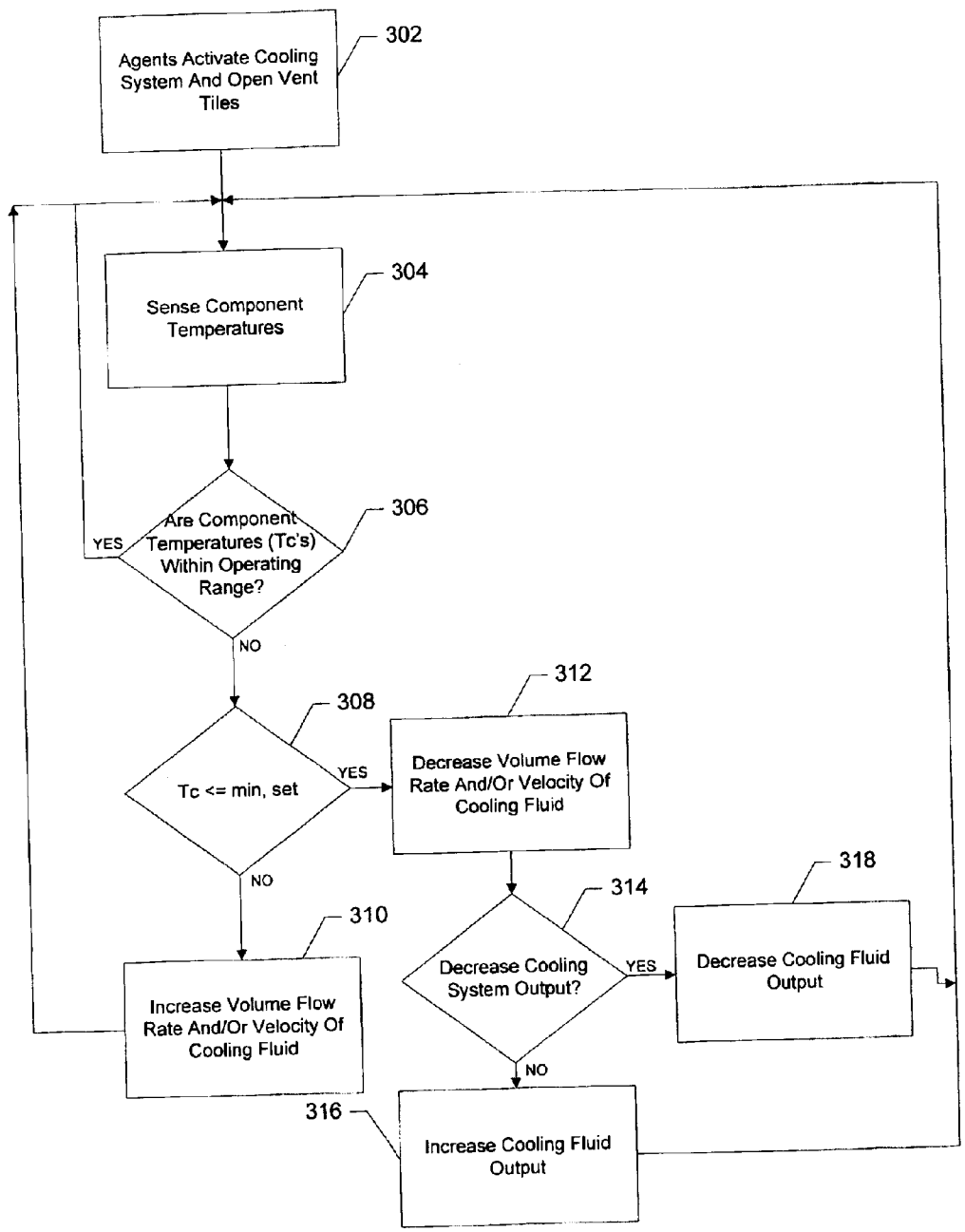
FIG. 3A is a flow diagram providing the objectives and operations for cooling a data center in accordance with one implementation of the present invention.

FIG. 3A is a flow chart diagram 300 providing the objectives and operations for cooling a data center in accordance with one implementation of the present invention. Agents distributed throughout a data center work together, as described in further detail later herein, to achieve the overall objective of cooling a data center with reduced energy requirements. To achieve the overall objective, different agents may be assigned portions of the overall objective and tasks to monitor and parameters for operating the data center.

In a first implementation described in conjunction with FIG. 3A, agents detect the temperature of components in the racks and respond by moving vent tiles to adjust the volume flow of the vent tiles. As needed, other agents responsive to these component temperatures may be used to modify the output of the cooling system to meet the overall objective of cooling the data center. For example, these other agents may modify cooling system components including fan, compressor, heat-exchanger, and any other parts of the cooling system. In a second and alternate implementation described subsequently, some agents monitor the temperature to adjust the volume flow of the cooling fluid while other agents separately modify the output of the cooling system in response to measuring the cooling fluid pressure rather than the temperature of the cooling fluid. This latter implementation is described in conjunction with FIG. 3B.

In the former implementation in FIG. 3A, various agents of the present invention activate a cooling system and open one or more vent tiles (302). A CRAC agent may initially set the fan, compressor, and other portions of the cooling system to initial values to be changed later as the cooling system operates. Rack and row agents adjust vent tile openings and positions and may communicate with the CRAC agent as described in further detail later herein.

Agents receive component temperatures (Tc's) sensed by one or more distributed temperature sensors (304). The number of sensors used depends on the equipment configuration and the accuracy required in monitoring and adjusting the cooling. For example, a larger number of sensors distributed appropriately may generate more information and control the cooling more accurately and efficiently. Component temperature (Tc) corresponds to the heat load of a component dissipating heat and, in some cases, corresponds to the temperature of larger subsystems contained in a rack or racks. In one implementation, component temperature (Tc) values are based upon particular temperature dissipation specifications provided by the manufacturers of the components or subsystems. Alternatively, Tc's may be based upon temperatures determined empirically through rigorous temperature measurements as the components are operated.

One or more agents determine whether the measured component temperatures are within a predetermined range of operating temperatures (306). In one implementation, the operating temperature is a temperature range between a maximum set point temperature (Tmax,set) and a minimum set point temperature (Tmin,set). The operating temperature range of the subsystems and components located in the racks can be determined according to a number of factors including: the operating temperatures set forth by the manufacturers or determining an optimal range of operating temperatures for a subsystem or component empirically.

A system or component continues to be monitored or sensed (304) as long as the subsystems or components are in the operating temperature range and properly cooled. Both Tmin,set and Tmax,set are threshold temperatures in the operating range used to determine whether to increase or decrease the flow of cooling fluid delivered to the racks and components. As previously described, this predetermined temperature range may be based upon a plurality of factors including a determination that the operating temperature range substantially optimizes the performance of the subsystems and components contained in the racks.

In the event an operating system or component falls outside the operating temperature range, agents determine whether the sensed temperature equals or falls below the Tmin,set (308). Agents operate the vent controller to decrease the volume flow rate and/or the velocity of cooling fluid to those racks (312) depending on the degree that the Tc's of the components in the racks are below the Tmin,set value.

Agents may also determine of whether to decrease either or both the volume flow rate and the velocity of the cooling fluid (312) based upon the detected temperature in certain portions of a rack. For example, if the subsystems on a bottom half of a rack are operating at 50 percent of maximum capacity, and the subsystems on an upper half of the rack are operating at or near zero capacity, the velocity of the cooling fluid may be reduced whereas the volume flow rate may remain substantially constant. This may occur, for example, because the cooling fluid need not travel a relatively long distance but may still need to supply the bottom half with a sufficient amount of cooling fluid.

Alternatively, if the component temperatures (Tc's) of some of the racks exceed the Tmin,set (308) or exceed the Tmax,set, agents may operate the vent controllers to increase the volume flow rate and/or the velocity of cooling fluid to those racks (310). Once again, agents can determine whether to increase either or both the volume flow rate and the velocity of the cooling fluid based upon the detected temperature of the racks or at specific portions of the rack. For example, if the subsystems on the top half of a rack are operating at 100 percent capacity, and the subsystems on a bottom half of the rack are operating at or near zero capacity, the velocity and the volume flow rate of the cooling fluid may both be increased. This may occur, for example, because the cooling fluid must travel a relatively long distance and supply the top half with a sufficient amount of cooling fluid.

In one aspect of the present invention, agents can affect the temperature objective by incrementally varying the cooling fluid flow through the vent tiles by either decreasing the volume flow rate and/or velocity of the cooling fluid flow (312) or increasing the volume flow rate and/or velocity of the cooling fluid (310). By repeating this process a number of times, agents can bring the temperature of the rack substantially within the predetermined range. There may be instances, however, where an agent cannot change a vent tile to change the flow rate or velocity of the cooling fluid and bring the temperature for that rack (Tc) within the predetermined range.

In addition to changing vent tile positions, agents may also determine whether to decrease (318) or increase (316) the cooling fluid output through the cooling system controller. These changes modify operation of several cooling system components including, the compressor, the fan, and any other component associated with the cooling system portion. In one implementation, agents determine whether to modify the cooling fluid output in response to the manipulations made to the vent tiles by the vent controller. For example, if the total amount of decreases in the volume flow rates of the cooling fluid exceeds the total amount of increases in the volume flow rates flow of the cooling fluid, agents may instruct the cooling system controller operate to decrease the cooling fluid output (316). Alternatively, if the total amount of increases in the volume flow rates of the cooling fluid exceeds the total amount of decreases, agents may instruct the cooling system controller to increase the cooling system output (318).

Agents continue to receive sense information for the component temperatures (Tc's) (304) to determine if the changes in the volume flow rates of the cooling fluid correspond to the cooling fluid output changes. The agents continue to receive sense information on the component temperatures as long as the cooling system remains in operation cooling the subsystems and components. In many cases, the component temperatures (Tc's) in some subsystems and components in the racks may fall below the Tmin,set, whereas the Tc's of other racks may exceed the Tmax,set. Consequently, many of the agents operate substantially simultaneously to effectuate the proper degree of cooling on the various racks and may operate both independently or in collectively to achieve their overall objectives.

Figure 3B:
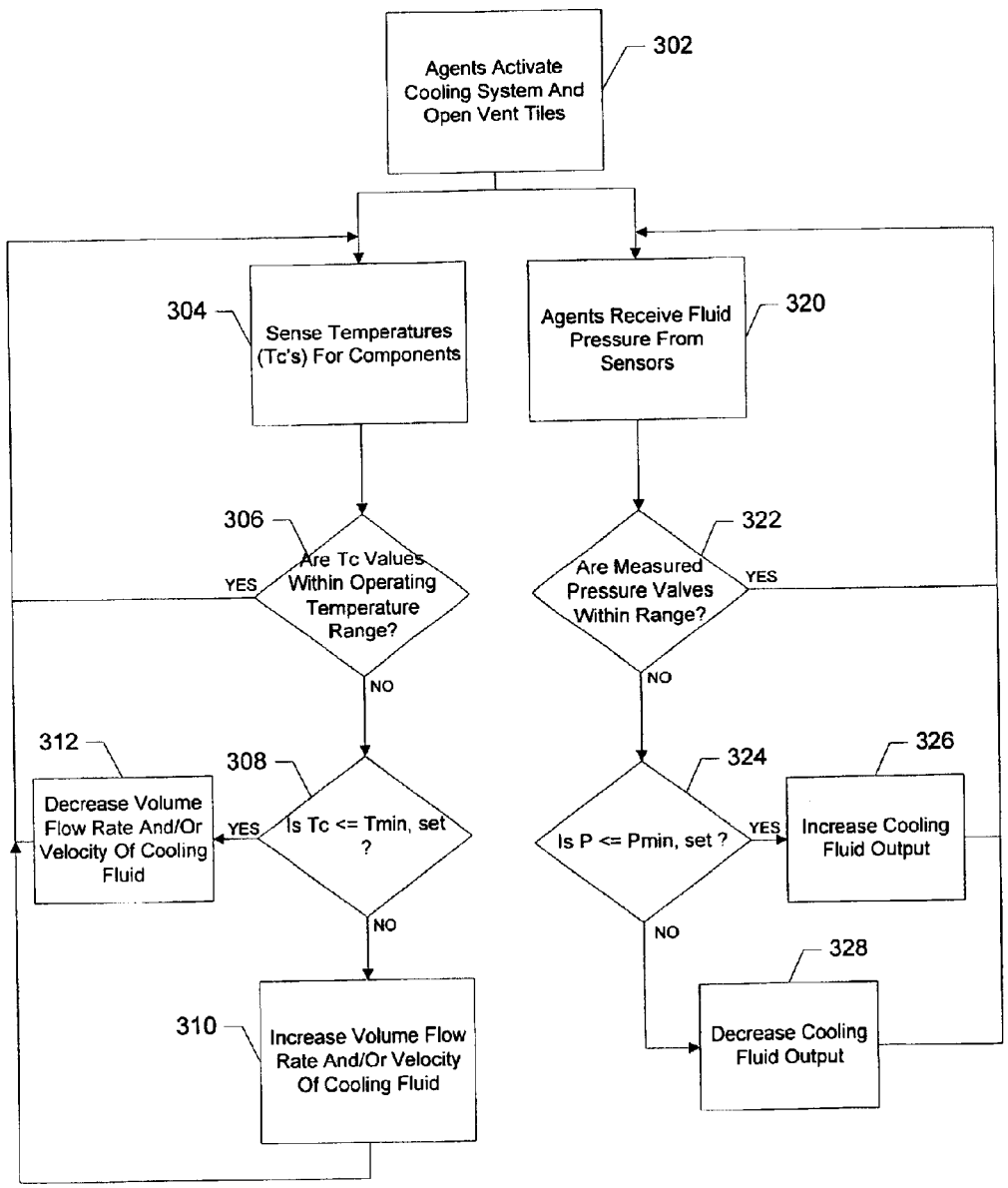
FIG. 3B shows a flow diagram of adjusting operating characteristics in accordance with one implementation of the present invention.

FIG. 3B is a flow chart diagram providing the objectives and operations for cooling a data center in accordance with an alternate implementation of the present invention that uses both temperature and pressure measurements. In this implementation, agents adjust the volume flow of the cooling fluid in response to monitoring the temperature and change the output of the cooling system elements including the fan, compressor, heat-exchanger, or any other parts of the cooling system based on cooling fluid pressure measurements. Because these agents modify volume flow of the cooling fluid based on temperature measurements as described above, similarly numbered operations previously described with respect to FIG. 3A will not be discussed.

In this implementation, agents controlling cooling fluid output instead receive sense information measuring the cooling fluid pressure in the plenum as it is delivered to vent tiles (320). In one implementation, the pressure is detected using one or more pressure sensors distributed at various points along the plenum as needed to make an accurate measurement. This measured pressure may be relayed to the cooling system controller 222 and corresponding agent for further processing. In one implementation, an agent associated with cooling system controller (CRAC) 222 determines whether the measured pressure is within a predetermined pressure range.

The agent comparing the measured pressure with the predetermined pressure range, determines whether the measured pressure (P) is below or equal to a minimum pressure set point (Pmin,set) (322). The predetermined pressure range may be based upon a number of factors including, for example, different threshold operating pressures or range of pressures determined through testing to substantially optimize the performance of the cooling fluid output passing through the vent tiles. In general, the predetermined pressure range includes threshold pressures for determining whether an increase or decrease in cooling fluid supply within the proper portion of the plenum is appropriate. The predetermined pressure range is bounded by a minimum set point pressure (Pmin,set) and a maximum set point pressure (Pmax,set).

The predetermined pressure range may be set according to a maximum desired volume flow rate and/or velocity of the cooling fluid to be ejected through the vent tiles. In addition, the predetermined pressure range may be the substantial optimum operating pressure desired for controlling the flow of cooling fluid through the vent tiles.

If the measured pressure is within the predetermined pressure range, the agents continue to receive and monitor the cooling fluid pressure (320). However, if the agents determine that the measured pressure is below or equal to the (Pmin,set), agents can operate cooling system controller to increase the cooling fluid output (326). For example, cooling fluid output can be increased by modifying the operation of the compressor, increasing the compressor capacity, or the fan output. Otherwise, if the pressure is determined to exceed Pmin,set, or even exceed Pmax,set, an agent operates cooling system controller 222 to decrease cooling fluid output by decreasing the compressor capacity, the fan output and/or any other component of the cooling systems (328).

Agents continue to receive sense information for the cooling fluid pressures (320). The agents continue to receive sense information on the cooling fluid pressures as long as the cooling system remains in operation cooling the subsystems and components. In many cases, the cooling fluid pressures are varying to different degrees and consequently and the agents operate substantially simultaneously to effectuate the proper pressure of fluid on the various racks and may operate both independently or in collectively to achieve their overall objectives.

Figure 4:
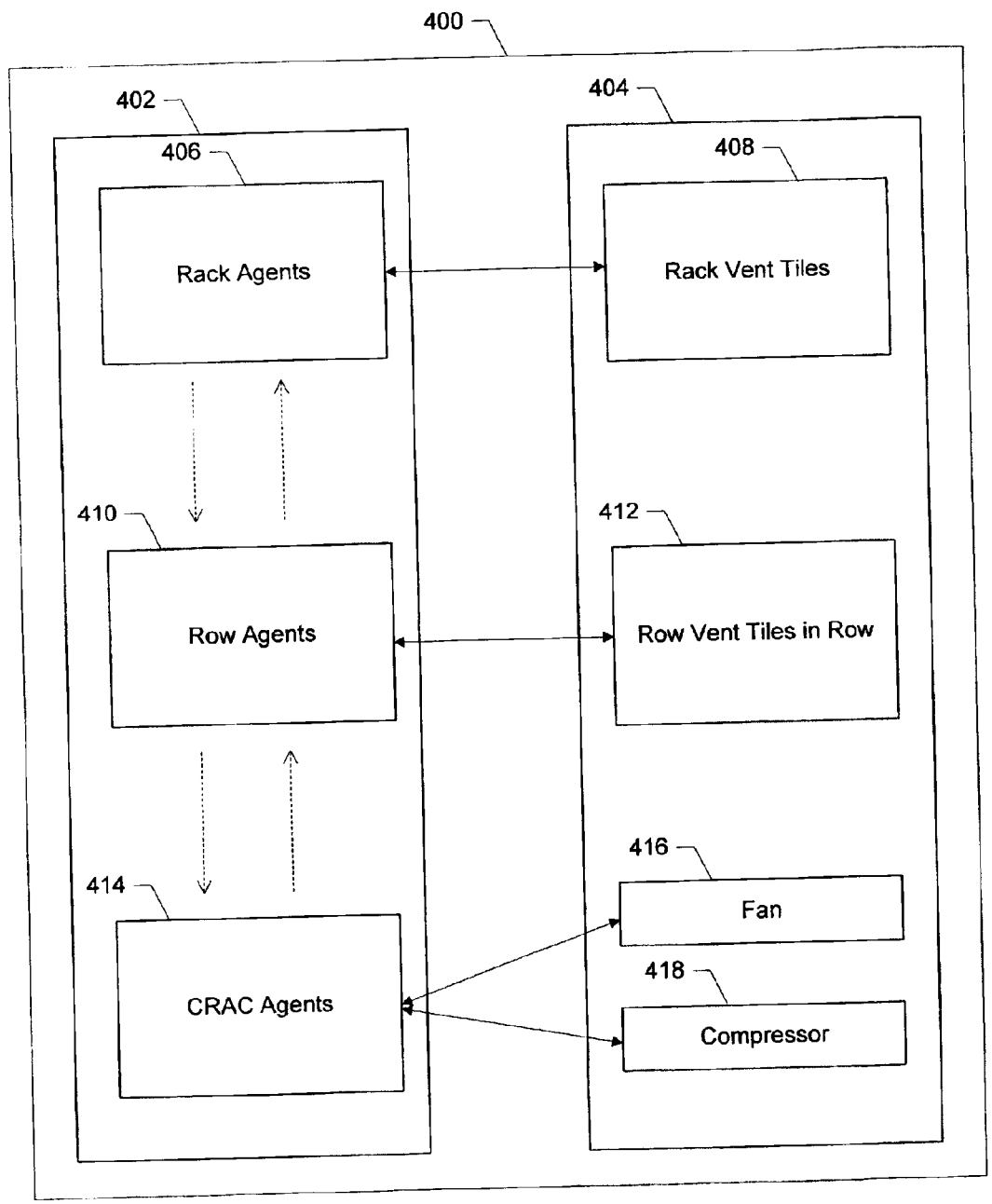
FIG. 4 is a schematic illustrating the relationship among various software agents in accordance with one implementation of the present invention.

FIG. 4 is a block diagram illustrating the relationship among various software agents and the physical structures of a cooling system in accordance with one implementation of the present invention. In this implementation, a data center cooling system 400 includes agents 402 and corresponding physical structures 404. Agents 402 include rack agents 406, row agents 410, and CRAC agents 414 while physical structures 404 include racks of vent tiles 408, rows of vent tiles 412, fan 416, and compressor 418.

Rack agents 406 operate various aspects of a rack including opening and closing of rack vent tiles 408 in one or more racks. Each vent tile in rack vent tiles 408 provides cooling fluid to at least one rack of components and subsystems that need cooling. Further, rack agents 406 also operate temperature sensors on or near the racks and gather corresponding temperature information. Information collected by rack agent 406 can be processed directly by rack agent 406 or passed along to other agents in cooling system 400 to meet their respective objectives in the cooling process.

Row agents 410 operate row vent tiles 412 used for cooling multiple racks within a row. Row vent tiles 412 can be operated to provide one or more specific rack vent tiles 408 cooling fluid. These row vent tiles 412 can be located internal to the equipment being cooled or external where there are providing cooling fluid to other rack or row vent tiles. Like rack agents 406, row agents 410 operate temperature sensors and other sensors used to gather information for the temperature and other sense information. Row agents 410 can also consolidate information provided from other agents, for example rack agents 406, and use the consolidated temperature and/or cooling information to further meet objectives associated with row agents 410 and used in the cooling process.

CRAC agents 414 operate cooling system equipment including fans, compressors, and heat exchangers and any other equipment used for removing heat from a cooling liquid. Generally, CRAC agents 414 receive and consolidate temperature, pressure, and other information sensed by other agents in the cooling system 400. In response to this information, CRAC agents 414 control fan 416 (typically to modify coolant flow) and compressor 418 (typically to affect coolant temperature through the use of a heat exchange condenser).

CRAC agents 414 can control multiple fan 416, compressor 418, and other cooling equipment in the corresponding one or more CRAC. Additionally, CRAC agents 414 communicate information on the operation and status of the CRAC to other agents and subsystems using bidirectional or two-way wired or wireless communication mechanisms. This can be used by the various agents for reporting purposes as well as to assist the agents in meeting their objectives in the overall cooling process. For example, row agents 410 engage in two-way communication of information concerning cooling provisioning with CRAC Agents 414.

Figure 5:
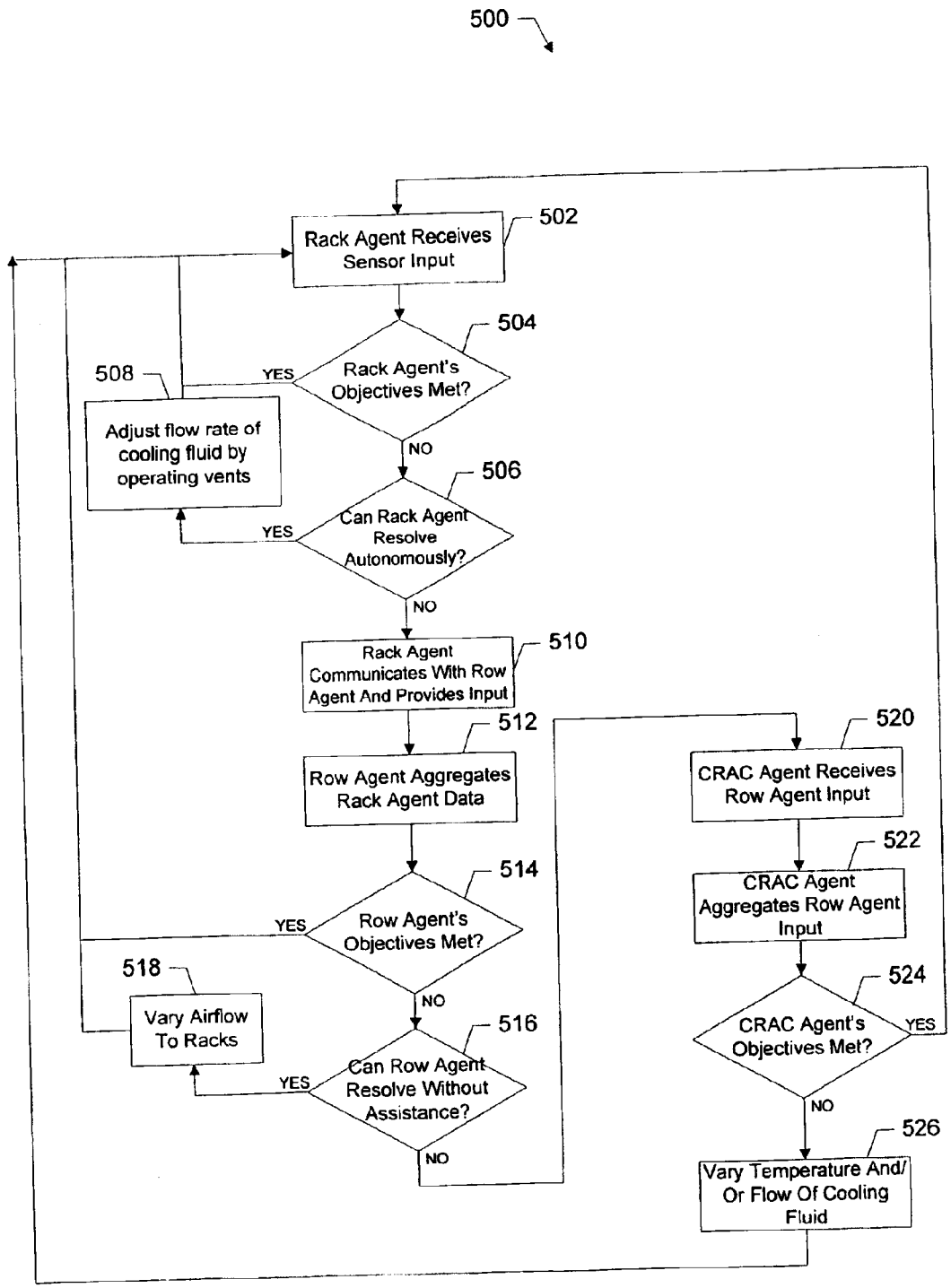
FIG. 5 is a flow diagram of the operations of various software agents in accordance with one implementation of the present invention.

FIG. 5 depicts a flow chart diagram 500 of the operations between various software agents and the physical structures they control in accordance with one implementation of the present invention. Initially, a rack agent receives periodic sensor data input from a temperature sensor in its rack (502). Alternatively, the sensor data input could be provided from a pressure sensor in the rack or a plenum leading to the rack. In either implementation, the rack agent then compares this sensor data against the temperature objectives set for that particular rack (504).

A rack temperature objective can be implemented in various ways, and can be set or affected by automated routines and formulas, as well as manual operator input. In one implementation, the rack objective could be to keep the rack temperature sensor data within a certain temperature range. The rack objective could have the range vary based upon computing loads or the type of equipment in the particular rack. It could also focus on any variance in the sensor temperature readings over time. In yet another implementation, the rack objective temperature range itself could vary based upon statistical formulas that, for example, are tailored to the macro temperature conditions in and heat exchange capabilities of the data center. Dynamically varying objectives could be set to anticipate variations in temperature based upon historical experience, and/or readings from and actions of surrounding sensors and agents. For example, temperatures during the evening hours or winter seasons may be cooler and require less cooling from the cooling system.

If one or more sensor readings indicate that the rack's objective has been met (504), the rack agent takes no further action and continues to receive periodic sensor input (502). However, should the one or more sensor readings not meet the rack's objective, the rack agent then determines whether it can vary the temperature level autonomously (506). In one implementation, rack agents can autonomously vary temperature through opening or shutting a limited number of rack vent tiles associated with that rack. Based on these and other controls, the rack agent determines whether it can meet its objectives through opening and closing rack vent tiles under its direct control. If the rack agent can affect the temperature itself adequately, it controls its rack vent tiles (508) by either opening or shutting them to locally provision more coolant flow to its rack.

In the situation where the temperature objectives of the rack cannot be met through such local provisioning, the rack agent communicates with its associated row agent (510). The row agent receives input from a plurality of rack agents under its control, and aggregates the row agent data (512) to determine whether the objectives of that row are being met (514).

As with the rack objectives described previously, row objectives can be based on factors that include dynamically calculated formulas, real-time data, and manual operator input in order to meet the higher-level temperature provisioning needs of that rack and its surroundings. As rack agent objectives are compared against the conditions as reported by a number of rack agents in that row, row objectives can also take into account, for example, determining how many row agents have not met or are having difficulty meeting their objectives.

If the row agent determines that its own row temperature objectives are being met the row agent takes no further corrective action. In one implementation, as long as the row temperature objectives are being met the row agent does not take further corrective action unless a particular rack or racks in that row indicate to the row they are not meeting their respective cooling objectives and need assistance. In general, the row agent cannot override individual rack agent objectives and similarly, rack agents each must meet their objectives and communicate the need for more or less cooling and cannot rely on the row agents to meet their rack agent objectives.

Should the row agent not meet their objectives, the row agent determines whether changing the physical structures under its control—namely, opening and/or closing rack vent tiles associated with that rack—will resolve the temperature variation (516). If so, it controls rack vent tiles (518) in order to vary the coolant flow to the particular row, or to particular racks within that row. Of course, the row agent cannot operate the rack vent tiles if it would cause the rack agents to not meet their rack agent objectives.

Should the row agent be unable to resolve the rack agent temperature variance in its row without further assistance, it communicates to one or more CRAC agents (520). A CRAC agent aggregates such row data (522), and determines whether its objectives are met (524). In one implementation, no further action is taken by the CRAC agent when the objectives for the portion of the data center affected by the CRAC are met.

In the event, the temperature objectives of the CRAC agent are not met, the CRAC agent provisions a change in cooling (526). For example, the CRAC agent provisions this cooling change by controlling the rate of heat exchange of the coolant, or the coolant flow, typically through controlling the speed of the fan or fans associated with the CRAC.

Figure 6:
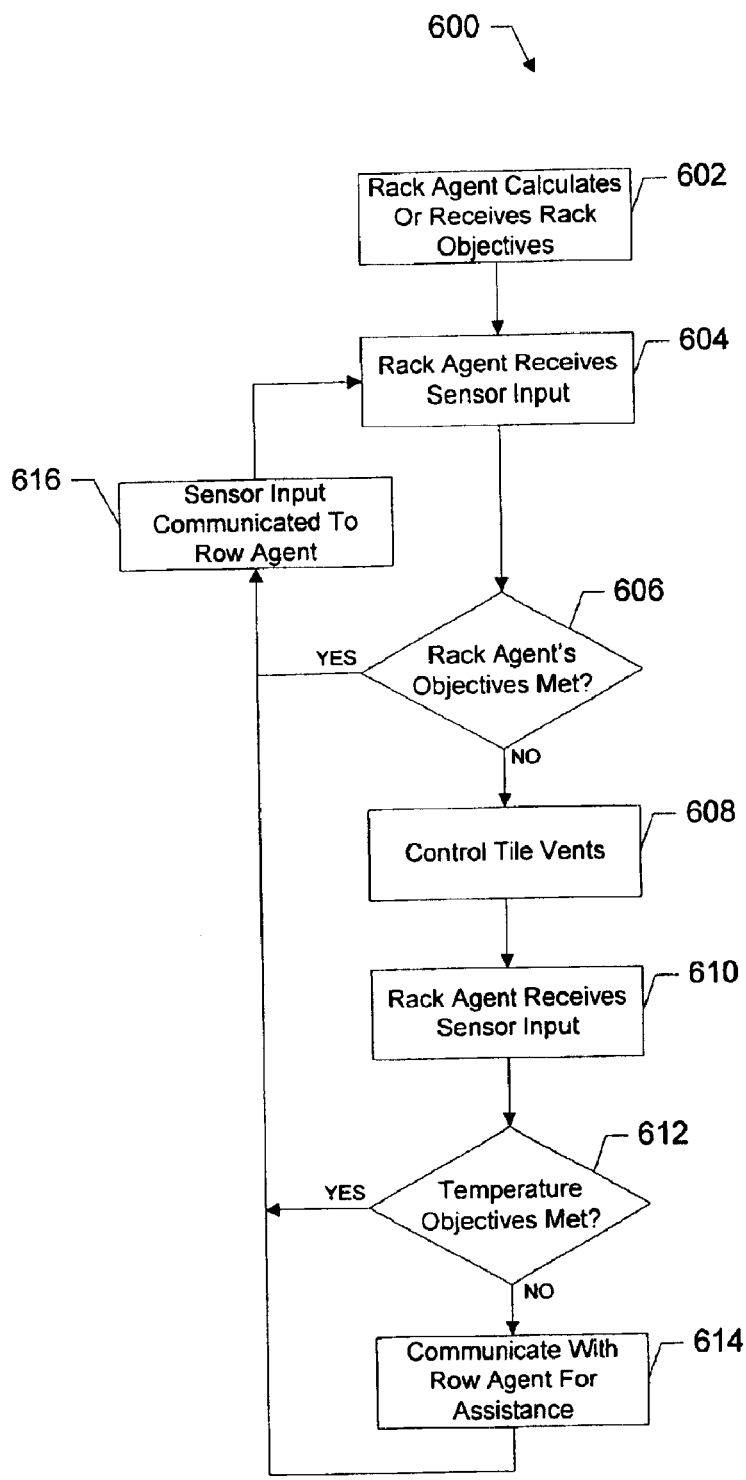
FIG. 6 is a flow diagram of the operations and interactions among the rack agents and other software agents and physical structures under the rack agents' control in accordance with one implementation of the present invention.

FIG. 6 is a flow chart diagram of system 600, providing the operations performed by a rack agent in accordance with one implementation of the present invention. In this implementation, the rack agent dynamically receives and/or calculates its temperature objectives (602). As previously described, these temperature objectives can be affected through historical experience, formulaic algorithm, and/or manual operator input. The rack agent generally receives temperature sensor input (604) from sensor(s) placed on or near the heat-generating equipment in the particular rack.

The rack agent compares the temperature received from the sensors to the rack agent's temperature objectives (606), and determines whether the temperature readings meet its objectives. If they do, the rack agent reports its sensor readings to a row agent for further processing (616), and returns to receiving sensor input.

If the temperature reading does not meet the rack agent's objectives, the rack agent varies the flow of coolant by opening or closing the vent tiles under its control (608). If the temperature in the rack is too warm for the agent's objectives, the rack agent opens the vent tiles. If the temperature is too cool, the agent closes the vent tiles under its control, reducing the coolant flow to the rack and allowing for more economical provisioning of cooling fluid in the data center.

In one implementation, after controlling the vent tiles, the rack agent polls for additional temperature sensor readings (610), and compares those new readings with its temperature objectives (612). Should the rack agent's temperature objectives still not be attained despite adjusting the cooling controls for which it is responsible, the rack agent communicates with the row agent for assistance (614).

Figure 7:
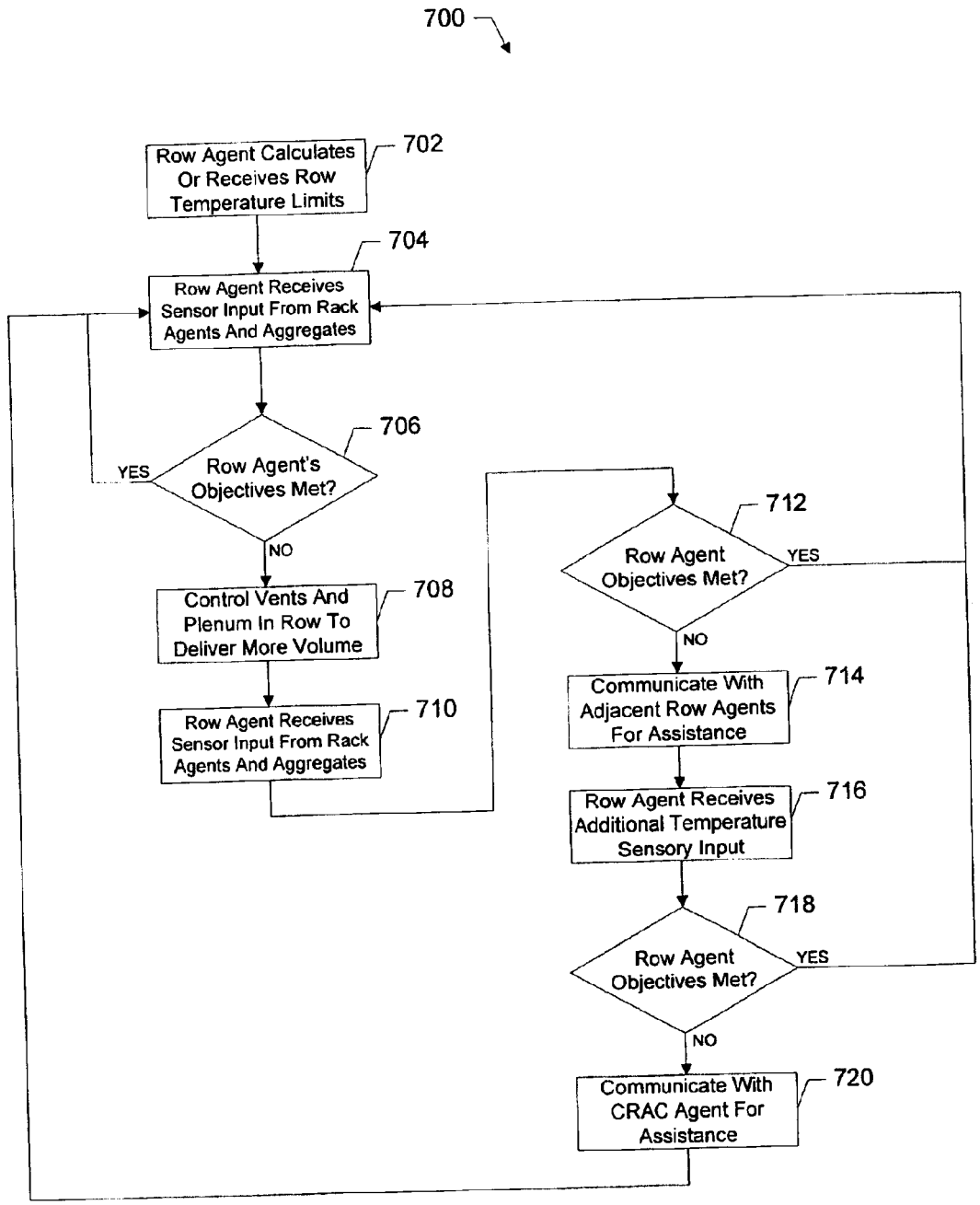
FIG. 7 is a flow diagram of the operations and interactions among the row agents and other software agents and physical structures under the row agents' control in accordance with one implementation of the present invention.

FIG. 7 is a flow chart diagram of system 700, depicting the operations associated with a row agent in accordance with one implementation of the present invention. A row agent receives and/or dynamically calculates its own temperature objectives using one or more of the previously described operations (702). The row agent then receives ongoing sensory temperature communication from a number of rack agents that comprise its row, along with periodic communication from other row agents, which are aggregated together (704) to form a snapshot of the thermal provisioning needs of the row.

The row agent compares this aggregate sensory input to its row objectives (706) to determine whether the row sensory temperatures are within its objectives. Should the objectives be met, the row agent returns to poll for subsequent temperature sensor data.

If the row agent's objectives are not met, the row agent controls the vent tiles and flow of cooling fluid through the plenum in the row (708). The row agent then receives temperature sensor input (710), in order to determine whether controlling the vent tiles in its row has met its temperature objectives (712). If so, the row agent returns to receiving and aggregating sensory data (704). If the objectives are still not met, the row agent communicates with other adjacent row agents for assistance in cooling (714). In response, adjacent or nearby row agents may shunt a portion of the cooling fluid to the requesting row agent and facilitate meeting the particular row agents objective in keeping the subsystems and components at the proper temperature range.

The row agent then receives additional temperature sensory input (716), comparing it again against its objectives (718). If its objectives are still not met, the row agent communicates with the CRAC agent (720) for assistance in increasing the heat exchange or flow of coolant.

Figure 8:
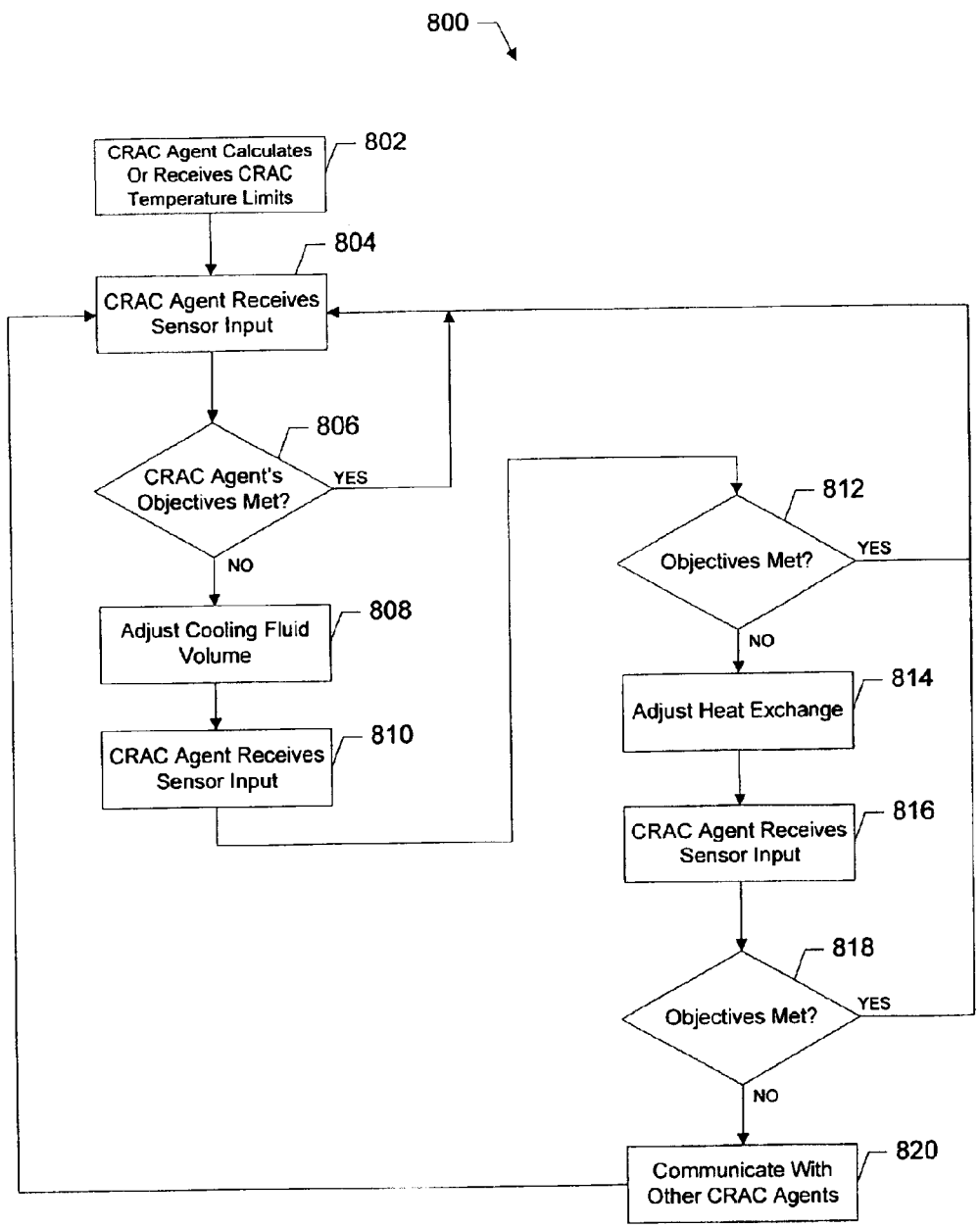
FIG. 8 is a flow diagram of the operations and interactions among the CRAC agents and other software agents and physical structures under the CRAC agents' control in accordance with one implementation of the present invention.

FIG. 8 is a flow chart diagram of system 800, depicting the operations associated with a CRAC agent in accordance with one implementation of the present invention. Initially, the CRAC agent calculates and/or receives temperature objectives for its CRAC (802). The CRAC agent receives temperature sensor input and communication from row agents which it aggregates (804) in order to determine whether its temperature objectives are being met (806). If its objectives are being met, the CRAC agent continues polling for temperature sensor input (804).

If the CRAC agent's objectives are not being met, the CRAC agent adjusts the cooling fluid volume (808). In one implementation, this generally involves increasing or decreasing the fan speed at which cooled air is circulated into the data center from that CRAC. The CRAC then receives additional temperature input (810), and determines whether its CRAC agent objectives are still not met (812).

If they are not yet met, the CRAC agent adjusts the heat exchange of the coolant fluid (814). In one implementation, this typically involves increasing or decreasing the operation of the air conditioner compressor or other portions of the cooling system.

After adjusting the level of heat exchange, the CRAC agent then receives additional temperature sensor readings (816), and determines whether its objectives are met (818). Should the objectives still not be met, the CRAC agent communicates with other CRAC agents for assistance (820). Other adjacent or nearby CRAC agents may increase their respective cooling systems output and divert the additional cooling fluid to the requesting CRAC agent thus meeting the particular CRAC agents objective in keeping the rack, rows, subsystems and components at the proper temperature range.

Method and apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Alternatively, the programmable system could be real-time sensing and control system that works directly with implementations of the present invention over a network or connection and not be required to store data and other information on a data storage system.

Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs.

While specific embodiments have been described herein for purposes of illustration, various modifications may be made without departing from the spirit and scope of the invention. Accordingly, the invention is not limited to the above-described implementations, but instead is defined by the appended claims in light of their full scope of equivalents. For example, although FIG. 2 illustrates three temperature sensors 212–216, it should be understood that the number of temperature sensors is not critical to the operation of the exemplary embodiment of the invention. Instead, the cooling system 202 may include any reasonably suitable number of temperature sensors to thus measure the temperatures of any reasonably suitable number of racks 108, 110, 112, 114 or portions thereof. The number of temperature sensors and the temperature measurements of the number of racks may be upgradeable, e.g., scalable, to include any additional components and/or racks that may be included in the data center.

Moreover, use of the term "rack" herein generally refers additionally to sections of the racks and thus may not necessarily refer to an entire rack. Thus, the use of the term "rack" is not meant to limit certain aspects to entire racks, but instead, is implemented to simplify the description of certain embodiments of the present invention.

Although FIG. 2 illustrates a single vent controller 204 configured to operate the vent tiles 206, 208, and 210, it should be understood that a plurality of vent controllers may be implemented to perform the functions of vent controller 204 without deviating from the scope and spirit of the present invention. Further, cooling system or CRAC controller 222 may operate substantially independent of vent controller 204 depending on whether CRAC controller 222 receives temperature information from vent tiles 206, 208, 210 and vent tile controller 204 or receives information from plenum temperature sensor 234 and plenum pressure sensor 232 instead in operation.

In general, implementations of the present invention can be used to cool a data center as well as many other spaces requiring cooling. For example, implementations of the present invention could be implemented for any kind of office-space environment or telecom infrastructure. Consequently, the infrastructure for carrying the cooling liquid is not only applicable to cold aisle/hot aisle configurations or under-flooring systems as described previously but can also be implemented in other areas or configurations depending on the particular situation. For example, cooling liquid can be carried through a tube or other enclosure placed in walls, above flooring systems, between and through equipment, or any other configuration as deemed necessary by the application of the present invention. Cooling infrastructure and methods designed in accordance with the present invention may even be routed on-chip adjacent to heat producing systems and circuitry and integrated into the chip-fabrication processes.

What is claimed is:

1. A method of controlling the temperature in a data center comprising:

receiving sensory data corresponding to a temperature from a subsystem in a data center;

processing the sensory data by a first agent in a hierarchy of agents to determine if the subsystems in the data center is operating within a predetermined temperature range;

adjusting a delivery rate for a cooling fluid using the first agent to keep the temperature range of the subsystem within the predetermined temperature range; and requesting a second agent from the hierarchy of agents to process the sensory data when the first agent cannot keep the temperature range within the predetermined temperature range unless the second agent redistributes the cooling fluid being delivered to one or more areas in the data center.

2. The method of claim 1 further comprising:

determining with a third agent from the hierarchy of agents the amount of cooling fluid to output when at least the first and second agent cannot keep the subsystem operating within the predetermined temperature range.

3. The method of claim 2 wherein the third agent is a cooling system agent that monitors and controls one or more cooling systems that deliver a cooling fluid to the racks and rows according to the first agent and second agent.

4. The method of claim 1 wherein the sensory data is derived from one or more of the following: a temperature measurement of the at least one subsystem, a temperature measurement in a plenum, and a pressure measurement in a plenum.

5. The method of claim 1 wherein the first agent is a rack agent that monitors and controls cooling for a rack of subsystems and corresponding components.

6. The method of claim 1 wherein the second agent is a row agent that monitors and controls the cooling for a row of racks having subsystems and corresponding components contained therein.

7. The method of claim 1 wherein the hierarchy of agents corresponds to a hierarchy of subsystems and components in the data center and each agent is responsible for maintaining that each hierarchical portion of the subsystems operate within a predetermined temperature range.

8. The method of claim 1 wherein adjusting a delivery rate for a cooling fluid changes the volume of cooling liquid being delivered.

9. The method of claim 1 wherein redistributing the cooling fluid includes decreasing the amount of cooling fluid being delivered in one area of the data center and increasing the amount of cooling fluid being delivered to another area of the data center.

10. The method of claim 1 further comprising:
determining with a third agent from a hierarchy of agents the amount of cooling fluid to output when a pressure level associated with the cooling fluid output is not operating within the predetermined pressure range.

11. A system for cooling a data center, comprising:
a cooling fluid delivery controller that uses a first agent in a hierarchy of agents to control the delivery rate of a cooling fluid to a rack having one or more subsystems and components and a second agent in the hierarchy of agents to control the delivery rate of the cooling fluid to a row having one or more racks; and
a cooling system controller that uses a third agent in the hierarchy of agents to control the amount of cooling fluid to output when at least the first and second agent cannot keep the one or more subsystems operating within a predetermined temperature range.

12. The system of claim 11 wherein the cooling fluid delivery controller is used to control vent tiles delivering a gas.

13. The system of claim 11 wherein the cooling fluid delivery controller is used to control spray devices delivering a liquid.

14. The system of claim 11 wherein the first agent is processed by the vent tile controller and the second agent is processed by another vent tile controller.

15. The system of claim 11 wherein the second agent from the hierarchy of processes redistributes the cooling fluid being delivered to one or more areas in the data center when the first agent cannot keep the temperature of the subsystem within the predetermined temperature range.

16. The system of claim 11 further comprising one or more sensors capable of measuring one or more of the following characteristics: a temperature measurement of at least one subsystem, a temperature measurement in a plenum, and a pressure measurement in a plenum.

17. The system of claim 11 wherein the first agent is a rack agent that monitors and controls cooling for a rack of subsystems and corresponding components.

18. The system of claim 17 wherein the delivery of the cooling fluid affects the volume of cooling liquid being delivered.

19. The system of claim 11 wherein the second agent is a row agent that monitors and controls the cooling for a row of racks having subsystems and corresponding components contained therein.

20. The system of claim 11 wherein the third agent is a cooling system agent that monitors and controls one or more cooling systems that deliver a cooling fluid to the racks and rows according to the first agent and second agent.

21. The system of claim 11 wherein the hierarchy of agents corresponds to a hierarchy of subsystems and components in the data center and each agent is responsible to maintain that a hierarchical portion of the subsystems operates within a predetermined temperature range.

22. The system of claim 11 wherein redistributing the cooling fluid includes decreasing the amount of cooling fluid being delivered in one area of the data center and increasing the amount of cooling fluid being delivered to another area of the data center.

23. The system of claim 11 further comprising:
a cooling system controller that uses a third agent in the hierarchy of agents to control the amount of cooling fluid to output when a pressure level associated with the cooling fluid output indicates the subsystem or component is not operating within the predetermined pressure range.

24. An apparatus for controlling the temperature in a data center comprising:
means for receiving sensory data corresponding to a temperature from a subsystem in a data center;
means for processing the sensory data by a first agent in a hierarchy of agents to determine if the subsystems in the data center is operating within a predetermined temperature range;
means for adjusting a delivery rate for a cooling fluid using the first agent to keep the temperature range of the subsystem within the predetermined temperature range; and
means for requesting a second agent from the hierarchy of agents to process the sensory data when the first agent cannot keep the temperature range within the predetermined temperature range unless the second agent redistributes the cooling fluid being delivered to one or more areas in the data center.

25. A computer program product, tangibly stored on a computer-readable medium, for controlling the temperature in a data center, comprising instructions operable to cause a programmable processor to:
receive sensory data corresponding to a temperature from a subsystem in a data center;
process the sensory data by a first agent in a hierarchy of agents to determine if the subsystems in the data center is operating within a predetermined temperature range;
adjust a delivery rate for a cooling fluid using the first agent to keep the temperature range of the subsystem within the predetermined temperature range; and
request a second agent from the hierarchy of agents to process the sensory data when the first agent cannot keep the temperature range within the predetermined temperature range unless the second agent redistributes the cooling fluid being delivered to one or more areas in the data center.

26. A method of controlling, the temperature of a rack in a data center, comprising:
receiving sensor information and objectives by a rack agent to keep the subsystems and components operating within a temperature range;
comparing the temperature received from the sensors to the rack agent's objectives;
determining whether the temperature readings meet its objectives and having the rack agent report its sensor readings to a row agent requesting assistance from the row agent in cooling when the rack agent's temperature objectives cannot be attained; and
varying the flow of liquid cooling when the temperature reading does not meet the rack agent's objectives.

27. The method of claim 26 wherein the rack agent varies the flow of coolant by opening or closing the vent tiles.

28. A method of controlling the temperature of a row in a data center, comprising:
receiving sensor information and objectives by a row agent to keep the subsystems and components operating within a temperature range;
comparing the temperature received from the sensors to the row agent's objectives;
determining whether the temperature readings meets the row agents objectives and having the row agent report its sensor readings requesting assistance from a CRAC agent or other row agents in cooling when the row agent's temperature objectives cannot be attained; and varying the flow of liquid cooling when the temperature reading does not meet the row agent's objectives.

29. The method of claim 28 wherein the row agent varies the flow of coolant by opening or closing the vent tiles.

30. A method of controlling the temperature of in a data center, comprising:

receiving sensor information and objectives by a cooling system agent to keep the subsystems and components operating within a temperature range;

comparing the temperature received from the sensors to the cooling system agent's objectives;

determining whether the temperature readings meets the cooling system agents objectives and having the cooling system agent report its sensor readings to other cooling system agents and request assistance from the other cooling system agents when the cooling system agent's temperature objectives cannot be attained; and varying the cooling system's output of a cooling liquid when the temperature reading does not meet the cooling system agent's objectives.

* * * * *